(12) United States Patent
Grant

(10) Patent No.: US 6,172,493 B1
(45) Date of Patent: Jan. 9, 2001

(54) SWITCH-MODE POWER CONVERTER CIRCUIT

(75) Inventor: David Grant, Dallas, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/389,811

(22) Filed: Sep. 4, 1999

(51) Int. Cl.[7] ...................................................... G05F 1/40
(52) U.S. Cl. .............................. 323/288; 323/224; 363/60
(58) Field of Search ........................... 307/910; 327/536; 323/282, 288, 224; 363/60

(56) References Cited

U.S. PATENT DOCUMENTS

| 4,803,612 | * | 2/1989 | Skovmand | ............................ | 323/284 |
| 5,627,460 | * | 5/1997 | Bazinet et al. | ........................ | 323/288 |
| 5,818,209 | * | 10/1998 | Masini et al. | ......................... | 323/289 |

* cited by examiner

*Primary Examiner*—Shawn Riley
(74) *Attorney, Agent, or Firm*—April M. Mosby; W. James Brady; Frederick J. Telecky, Jr.

(57) ABSTRACT

A switch mode power converter circuit (20, 50) adapted to receive a driver voltage $V_{diver}$ includes a boot capacitor $C_{boot}$ and a recharger for restoring the charge to the boot capacitor $C_{boot}$ to a voltage substantially equal to the driver voltage $V_{driver}$, where the recharger is internal to the circuit (20, 50). The recharger includes a synchronous rectifier $S_5$ which restores the boot capacitor $C_{boot}$ to a voltage equal to the driver voltage $V_{driver}$ less the voltage $V_{S5}$ across the synchronous rectifier $S_5$. Alternatively, the recharger may include a synchronous rectifier $S_5$ and a first switch $S_4$ of a charge pump circuit (22) that restore the charge to the boot capacitor $C_{boot}$ in parallel to a voltage equal to the driver voltage $V_{driver}$ less the voltage $V_{S5}$ across the synchronous rectifier $S_5$ plus the voltage $V_{S4}$ across the first switch $S_4$. The circuit (20, 50) is particularly useful for applications such as DSPs and mixed signal or analog circuits.

18 Claims, 3 Drawing Sheets

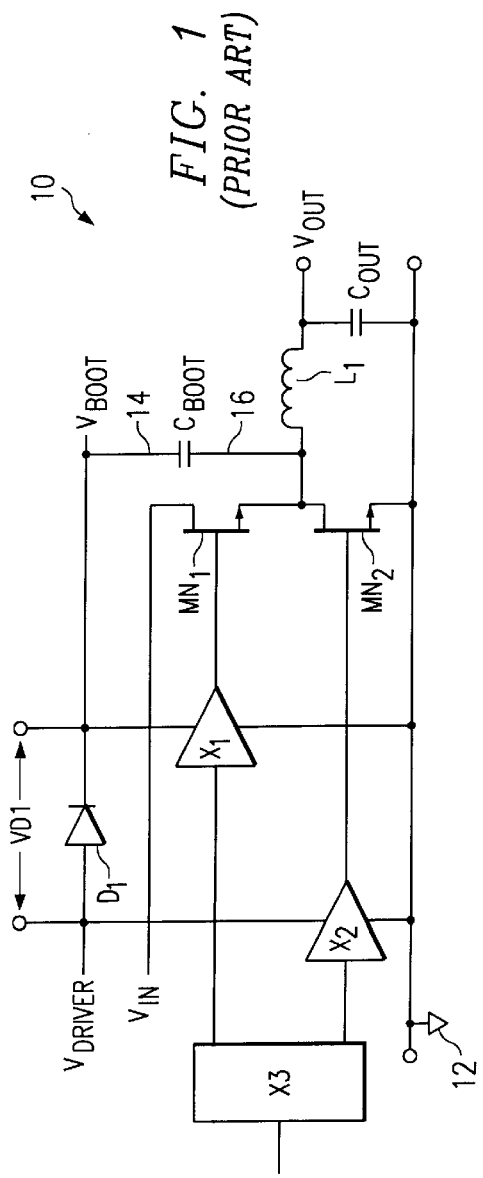
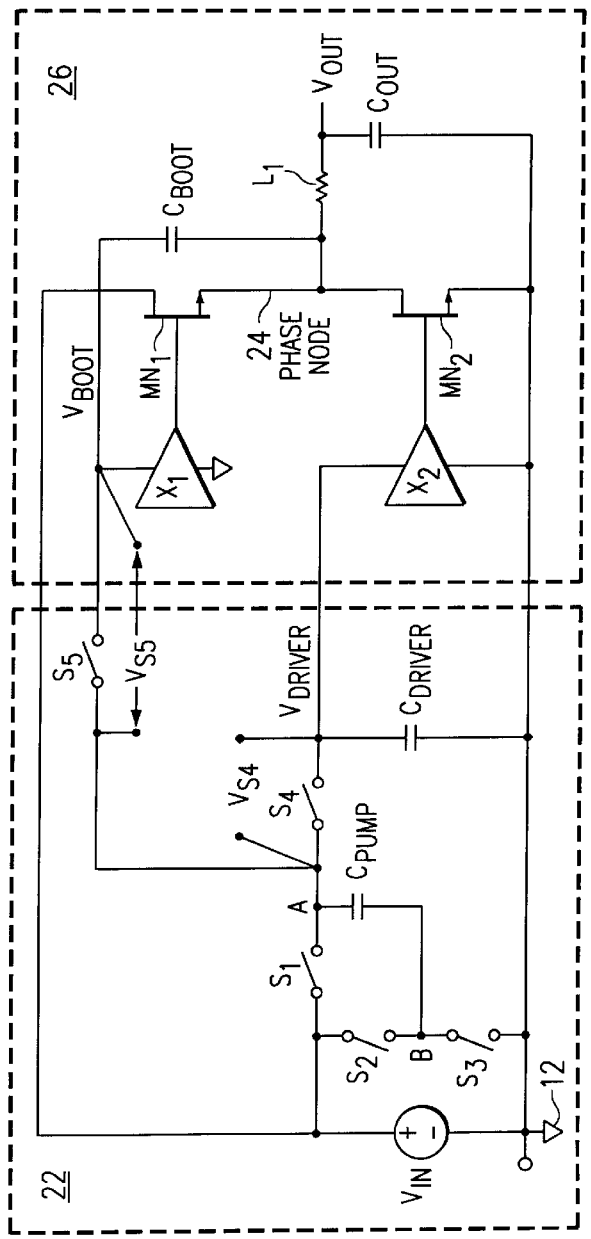
FIG. 1
(PRIOR ART)
FIG. 3

SWITCH-MODE POWER CONVERTER CIRCUIT

CROSS REFERENCE TO RELATED APPLICATIONS

Cross reference is made to the following patent applications, each assigned to the same assignee, the teachings of which are incorporated herein by reference:

| U.S. Pat. No. | Serial No. | Filing Date | Inventor | Title |
| --- | --- | --- | --- | --- |
| TBD | 09/389,691 | 09/04/99 | Grant | Charge-Pump Closely Coupled to Switching Converter to Improve Area Efficiency |
| TBD | 09/389,810 | 09/04/99 | Martinez, et al. | Controlled Linear Start-up in Linear Regulator |
| TBD | 09/389,809 | 09/04/99 | Grant et al. | Charge Pump Device and Method of Sequencing Charge |

TECHNICAL FIELD OF THE INVENTION

This invention relates generally to integrated circuits, more specifically to a switch mode power converter.

BACKGROUND OF THE INVENTION

As logic integrated circuits (ICs) have migrated to lower working voltages in the search for lower power consumption and higher operating frequencies, and as overall system sizes have continued to decrease, IC power supply designs with smaller size and higher efficiency are in demand. Switch mode power supplies, or DC to DC converters, as they are sometimes called, are frequently used in IC circuits such as digital signal processors (DSPs) and mixed signal analog circuits, etc., to efficiently convert an input supply voltage to voltage levels appropriate for internal circuitry as well as external circuitry that the IC is coupled to. For instance, a 2.8 volt supply voltage provided to a BiCMOS IC may need to be increased internally to 5.0 volts to operate internal CMOS circuitry. As appliances and circuit designs have continued to decrease in size, the need for smaller and more efficient IC switch mode power converters has increased.

FIG. 1 illustrates a block diagram of a buck topology switch mode power converter 10 of the prior art. Control circuit $X_3$ alternately turns on gate drivers $X_1$ and $X_2$. When driver $X_2$ is off, the gate of Field Effect Transistor (FET) $MN_2$ is connected to ground 12. FETs $MN_1$ and $MN_2$ are typically N-channel MOSFETs, for example. When $X_2$ is on, the gate of FET $MN_2$ is tied to $V_{driver}$, turning on FET $MN_2$. When driver $X_1$ is off, FET $MN_1$ is connected to ground 12, turning off FET $MN_1$. In some prior art buck topology converters, when driver $X_1$ is off, FET $MN_1$ is connected to the source of FET $MN_1$, which has the same effect as the circuit topology shown.

When driver $X_1$ is on, the gate of FET $MN_1$ is connected to the upper plate 14 of $C_{boot}$. Capacitor $C_{boot}$ is adapted to have some positive voltage stored on it, $V_{boot}$. The lower plate 16 of capacitor $C_{boot}$ is coupled to the source of FET $MN_1$, and by this means, the gate of FET $MN_1$ is pulled up to voltage $V_{boot}$ above the source of FET $MN_1$. Therefore, FET $MN_1$ is turned on, even as the source of FET $MN_1$ rises. Before FET $MN_1$ is turned on, the source of FET $MN_1$ is pulled to ground by FET $MN_2$: FET $MN_2$ is then turned off and FET $MN_1$ is turned on. As a result, the source of FET $MN_1$ rises to the voltage $V_{in}$ and the gate of FET $MN_1$ rises to $(V_{in}+V_{boot})$. The use of the "bootstrap capacitor" or boot capacitor $C_{boot}$ is a feedback technique which tends to improve linearity and input impedance of circuits operating over a wide range of input signals. Specifically, the boot capacitor $C_{boot}$ allows FET $MN_1$ to be turned on without there being a permanent supply available which is high enough to hold FET $MN_1$ on even when the source of FET $MN_1$ is at $V_{in}$.

When FET $MN_1$ is turned off and FET $MN_2$ is turned on again, the source of FET $MN_1$ returns to ground; however, some charge has been taken off boot capacitor $C_{boot}$, so its voltage $V_{boot}$ is lower than before. The voltage $V_{boot}$ on boot capacitor $C_{boot}$ needs to be restored to its previous value. In the prior art circuit 10 shown, the restoration of boot capacitor $C_{boot}$ is accomplished by diode $D_1$ that is connected between voltage $V_{driver}$ and the upper plate 14 of boot capacitor $C_{boot}$.

FIG. 2 is a block diagram of a charge pump of the prior art typically used to generate the voltage $V_{driver}$ for the circuit 10 shown in FIG. 1 from supply voltage $V_{in}$. The capacitor $C_{pump}$ is first charged to voltage $V_{in}$ by closing switches $S_1$ and $S_3$, with switches $S_2$ and $S_4$ open. Next, switch $S_1$ and $S_3$ are opened, and switches $S_2$ and $S_4$ are closed. Some of the charge stored in capacitor $C_{pump}$ is pumped into capacitor $C_{driver}$. When switches $S_2$ and $S_4$ are closed, the voltage at node A is slightly higher than the voltage at $V_{driver}$, which is caused by the voltage drop across switch $S_4$, created by the current flowing from capacitor $C_{pump}$ to capacitor $C_{driver}$.

SUMMARY OF THE INVENTION

The present invention achieves technical advantages as a circuit and method of restoring a charge to a boot capacitor of a switch mode power converter to an amount substantially equal to the amount of the driver voltage, $V_{driver}$.

In a first embodiment, a switch mode power converter circuit is adapted to receive a driver voltage, including a boot capacitor and means for restoring the charge to a boot capacitor to a voltage substantially equal to the driver voltage, where the restoring means is internal to the circuit. The restoring means may include synchronous rectifier which restores the boot capacitor to a voltage equal to the driver voltage less the voltage $V_{S5}$ across the synchronous rectifier $S_5$. Alternatively, the restoring means may include a synchronous rectifier and a first switch of a charge pump circuit that restore the charge to the boot capacitor in parallel to a voltage equal to the driver voltage less the voltage across the synchronous rectifier plus the voltage across the first switch.

In a second embodiment, a switch mode power converter circuit is adapted to receive an input voltage and generate a driver voltage. The circuit includes a charge pump circuit providing a driver voltage, and the charge pump includes at least a first switch and a first transistor. The circuit also includes a buck converter having a boot capacitor coupled at least to the first switch and the first transistor of the charge pump circuit. The first switch and the first transistor are adapted to recharge the boot capacitor in parallel to a boot voltage in an amount substantially equal to the driver voltage. The boot voltage is equal to the driver voltage less the voltage across the first transistor plus the voltage across the first switch.

Also disclosed is a method of restoring a charge to a boot capacitor of a switch mode power converter circuit, where the circuit is adapted to receive an input voltage and generate a driver voltage. The method includes the step of restoring the charge to the boot capacitor. The restored charge of the boot capacitor is substantially equal to the driver voltage, and the restoring means is internal to the circuit.

BRIEF DESCRIPTION OF THE DRAWINGS

In the drawings, which form an integral part of the specification and are to be read in conjunction therewith:

FIG. 1 is a prior art block diagram of a typical buck topology switch mode power converter;

FIG. 3 shows the charge pump circuit of FIG. 2 integrated with a buck converter, with switch $S_5$ adapted to restore the voltage $V_{boot}$ of boot capacitor $C_{boot}$ in accordance with a first embodiment of the present invention;

Like numerals and symbols are employed in different figures to designate similar components in various views unless otherwise indicated.

DETAILED DESCRIPTION OF PREFERRED EMBODIMENTS

Figure 2:
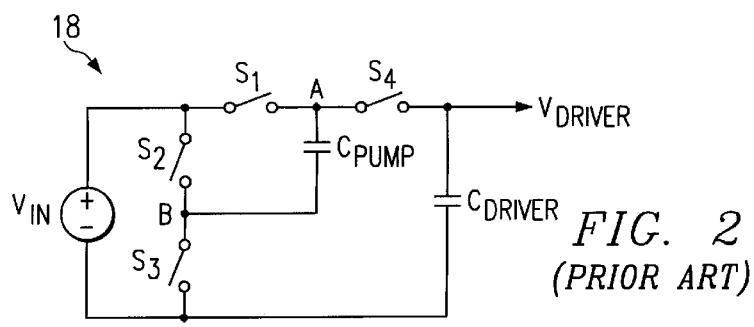
FIG. 2 illustrates a schematic of a prior art charge pump circuit used to generate a $V_{driver}$ supply.

A problem with the prior art switching converter circuit of FIG. 1 is that boot capacitor $C_{boot}$ may only be restored to a diode voltage drop below signal $V_{driver}$: voltage $V_{boot}$ may be restored to a maximum of $(V_{driver}-V_{D1})$. If diode $D_1$ is a diode internal to an integrated circuit (IC), the voltage drop $V_{D1}$ is large, perhaps a volt or more. If the diode $D_1$ is external to the IC, an additional component is required in the system design and the voltage drop is also large, typically about 400 mV or more. For example, if $V_{driver}$ is 5 V, the maximum recharge voltage $V_{boot}$ for boot capacitor $C_{boot}$ in the prior art is 4 V–4.6 V. In the case where the $V_{driver}$ supply is the same as $V_{in}$, the presence of the diode voltage drop $V_{D1}$ that reduces the recharge voltage available on the $C_{boot}$ capacitor may require one or more of the following four disadvantageous corrective design-arounds, for example: 1) the use of a lower voltage threshold ($V_t$) FET for transistor $MN_1$, which is expensive; 2) reducing the amount of drive voltage to FET $MN_1$, resulting in reduced efficiency; 3) reducing the amount of drive voltage to FET $MN_1$ while using more devices in parallel to maintain efficiency, which increases costs; or 4) increased supply voltage $V_{in}$ requirement. In the case where the $V_{driver}$ supply is provided by a charge pump, a solution to the reduced amount of recharge voltage available on the $C_{boot}$ capacitor may require one or more of the following, for example: 1) the use of a lower $V_t$ FET for transistor $MN_1$, which is expensive; 2) more stages in the charge pump which adds components and pin count, increasing costs and semiconductor real estate; 3) increased supply voltage for the charge pump, which is undesirable, because a low supply voltage is usually required; 4) reducing the amount of drive voltage to FET $MN_1$, resulting in reduced efficiency; or 5) reducing the amount of drive voltage to FET $MN_1$ while using more devices in parallel to maintain efficiency, which increases costs. Another solution in the prior art is to use a separate supply and abandon the boot capacitor technique, which requires a separate supply and is not feasible for many applications.

The present invention achieves technical advantages as a circuit and method of efficiently restoring the voltage charge to a boot capacitor of a switch mode converter to a voltage very close to $V_{driver}$, for example, within 0–200 mV of $V_{driver}$, solving the above problems in the prior art. Referring to FIG. 3, a first embodiment of the present invention, circuit 20, is shown, with a charge pump circuit 22 integrated with a buck (switch mode power) converter 26. In accordance with the present invention, switch $S_5$ is coupled between node A and the $V_{boot}$ voltage node, which switch $S_5$ is adapted to restore the voltage $V_{boot}$ on capacitor $C_{boot}$ in conjunction with switch S4. Preferably, switch $S_5$ is a PMOS transistor or synchronous rectifier having a voltage drop $V_{S5}$ of 200 mV or less, and more preferably, a voltage drop $V_{S5}$ of between 0–300 mV. Switch $S_5$ is adapted to recharge the boot capacitor $C_{boot}$ by the synchronization of the charge pump circuit 22 operation to the buck converter 26 such that switches $S_2$ and $S_4$ are closed with FET $MN_1$ is off and FET $MN_2$ is on. Refer to U.S. patent application filed herewith, entitled, "Charge Pump Device and Method of Sequencing Charge Pump Switches" by Grant. Because switch $S_5$ is connected to node A rather than at $V_{driver}$, as typical in the prior art, capacitor $C_{boot}$ is charged to the same voltage as capacitor $C_{driver}$. If switch $S_5$ were connected directly to $V_{driver}$, boot capacitor $C_{boot}$ would only be recharged to a voltage below that of $C_{driver}$ (below voltage $V_{driver}$) and switch $S_4$ would need to be larger with a larger voltage drop, to carry both the current out of $V_{driver}$ and the current out of $V_{boot}$. Thus, the present invention permits the use of smaller switches for $S_4$ and $S_5$, resulting in a semiconductor real estate savings of up to 50% for the aggregate physical surface area for $S_4$ and $S_5$. Preferably, switch $S_5$ is a PMOS device with a resistance sufficiently low to drop less than 300 mV across the device. Switch $S_4$ may be an NMOS device, further reducing the physical surface area by approximately 50% for switch $S_4$. Capacitor $C_{boot}$ may be $\frac{1}{10}$ the size of capacitor $C_{driver}$: capacitor $C_{boot}$ may be 1 $\mu$F and capacitor $C_{driver}$ may be 10 $\mu$F, for example. Capacitor $C_{pump}$ may be smaller than capacitor $C_{driver}$ and may be 1 $\mu$F, for example.

Figure 4:
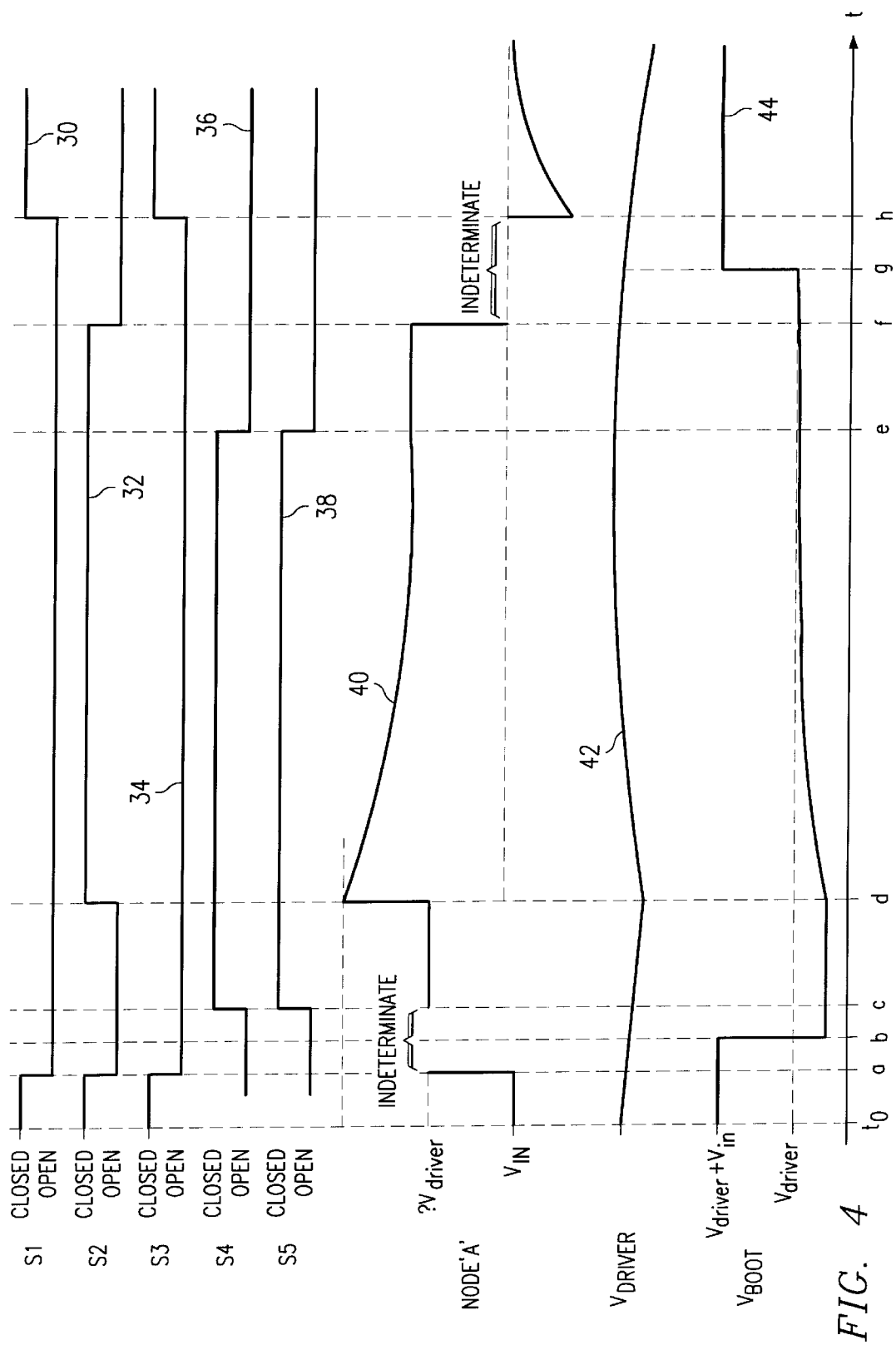
FIG. 4 is a timing diagram for the circuit shown in FIG. 3 showing how voltages $V_{driver}$ and $V_{boot}$ are restored.

FIG. 4 is a timing diagram of the circuit in FIG. 3 showing how $V_{driver}$ and $V_{boot}$ of circuit 20 are recharged in accordance with the first embodiment of the present invention, with the x-axis representing time. Switches $S_1$ (signal 30) and $S_3$ (signal 34) are closed. Capacitor $C_{pump}$ has been charged up to approximately $V_{in}$, so that node A (signal 40) begins at voltage $V_{in}$. At time "a," switches $S_1$ and $S_3$ are opened (signals 30 and 34, respectively). The voltage at node A is now indeterminate because all switches $S_1$, $S_4$, and $S_5$ tied to it are open, as are the switches $S_1$, $S_2$, $S_3$, $S_4$, and $S_5$ connected to capacitor $C_{pump}$. The voltage at node A is indeterminate between times "a" to "c" and between times "f" and "h."

At time "b," the phase node 24 drops, bringing down voltage $V_{boot}$ with it (signal 44), via capacitor $C_{boot}$ to a voltage less than $V_{driver}$. At time "c," switches $S_4$ and $S_5$ close (signals 36 and 38, respectively), connecting capacitor $C_{pump}$, and the nodes at voltages $V_{driver}$ and $V_{boot}$ together. There may be some current flow between nodes $V_{driver}$ and $V_{boot}$, which is undesired, so the system quickly progresses to time "d." At time "d," switch $S_2$ is closed (signal 32) which raises the voltage on the lower and also upper plates of capacitor $C_{pump}$ at nodes B and D, respectively. Charge flows from capacitor $C_{pump}$ through switches $S_4$ and $S_5$ in parallel, recharging both $V_{driver}$ and $V_{boot}$ (signals 42 and 44, respectively). Voltage $V_{boot}$ asymptotically approaches voltage $V_{driver}$ (signal 44). At time "e," switches $S_4$ and $S_5$ are opened (signals 36 and 38, respectively), and at time "f," switch $S_2$ is opened (signal 32). At time "g," the phase node 24 rises, bringing up voltage $V_{boot}$ with it (signal 44). At time "h," switches $S_1$ and $S_3$ are closed (signals 30 and 34, respectively), recharging capacitor $C_{boot}$ from $V_{in}$.

Preferably, $V_{boot}$ is charged to an amount equal to $V_{driver}$. However, it is possible for $V_{boot}$ to be charged to an amount higher or lower than $V_{driver}$, for example $V_{driver}+/-200$ mV in accordance with the present invention. The voltage of the boot capacitor $C_{boot}$ is approximately equal to:

$$V_{boot}=V_{driver}-V_{S5}+V_{S4}. \quad \text{Equation 1}$$

when $V_{S5}=V_{S4}$, $V_{boot}=V_{driver}$. If there is a difference between the switch voltages $V_{S5}$ and $V_{S4}$, then $V_{boot}$ will be slightly higher or lower than $V_{driver}$. For example, if $V_{driver}$ is 5.2 V, voltage $V_{S4}$ is 100 mV, and voltage $V_{S5}$ is 300 mV, $V_{boot}$ equals approximately 5.0 V. Similarly, if $V_{driver}$ is 5 V, voltage $V_{S5}$ is 100 mV and voltage $V_{S4}$ is 300 mV, $V_{boot}$ equals approximately 5.2 V. Preferably, voltages $V_{driver}$ and $V_{boot}$ are 5 V+/−200 mV.

Figure 5:
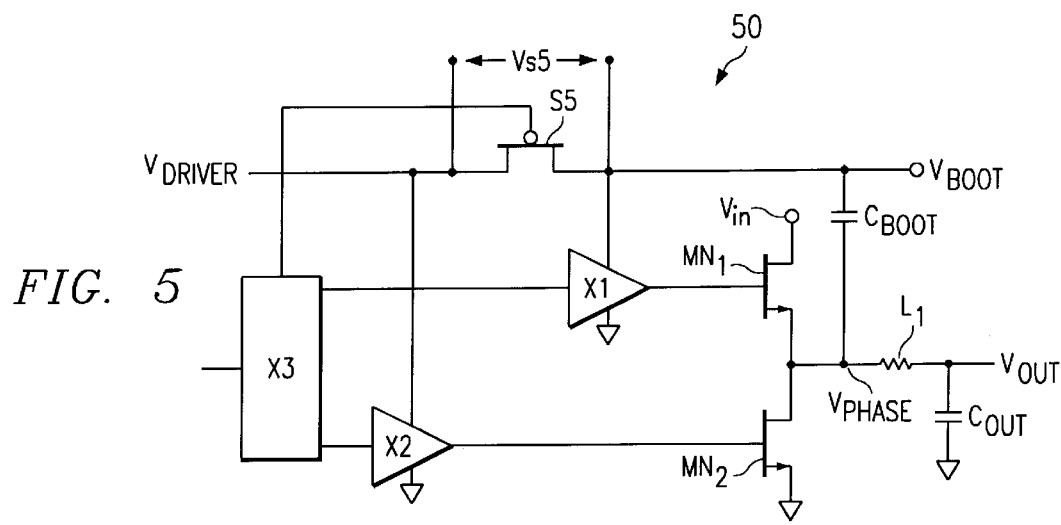
FIG. 5 illustrates a block diagram of a second embodiment of the present invention, with switch $S_5$ adapted to restore the charge $V_{boot}$ to boot capacitor $C_{boot}$ without the use of a charge pump.

A second embodiment of the present invention is shown in the circuit of FIG. 5. Diode $D_1$ of the prior art is replaced with a switch $S_5$, which switch is a synchronous rectifier or MOS transistor. The gate drive for $S_5$ is arranged such that switch $S_5$ is turned on when the source of $S_5$ is low. Preferably, a relatively small PMOS transistor is used for switch $S_5$, for example, having a voltage drop of 200 mV or less. Switch $S_5$ has a lower voltage drop than the diode $D_1$ of the prior art having a voltage drop of 400 mV or higher, and therefore the boot capacitor $C_{boot}$ can be recharged to a higher voltage closer to the voltage of $V_{driver}$. For example, the PMOS transistor $S_5$ may have a voltage drop of 100 mV and the driver voltage $V_{driver}$ may be approximately 5 volts, enabling the boot capacitor $C_{boot}$ to be restored to a voltage of approximately 4.9 volts.

Figure 6:
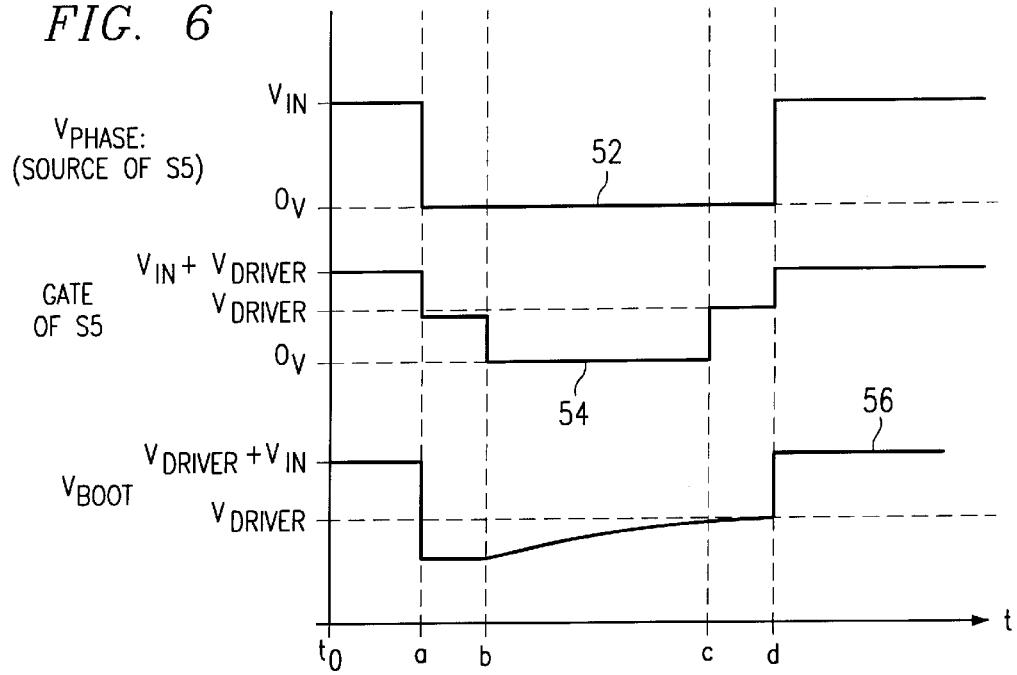
FIG. 6 is a timing diagram for the circuit shown in FIG. 5 showing how voltage $V_{boot}$ is restored.

A timing diagram for the second embodiment is shown in FIG. 6, with the x-axis representing time. In normal operation, voltage $V_{phase}$ displays a rectangular voltage waveform, switching between zero volts and $V_{in}$ (signal 52). At time "a," the gate of transistor $S_5$ is high; therefore, transistor $S_5$ is off. Voltage $V_{phase}$ drops from $V_{in}$ to 0 V. Voltage $V_{boot}$, which is connected to $V_{phase}$ by $C_{boot}$, also drops by the same amount, approximately equal to ($V_{in}$ less 0 V). The voltage on $V_{boot}$ (signal 56) is now lower than the level of $V_{driver}$, but the gate of $S_5$ remains tied to $V_{boot}$, so transistor $S_5$ remains off. Note that whenever transistor $S_5$ is to be held in the "off" state, the gate of $S_5$ is tied to the $V_{boot}$ node, and when $S_5$ is to be turned on, the gate of $S_5$ is tied to zero volts.

At time "b," the gate of transistor $S_5$ is now pulled to 0 V (signal 54), turning $S_5$ on. The $C_{boot}$ capacitor charges up, with its lower plate at $V_{phase}$ at ground. The upper plate of capacitor $C_{boot}$, at $V_{boot}$, is connected to $V_{driver}$ via transistor $S_5$. Capacitor $C_{boot}$ charges up, asymptotically approaching $V_{driver}$ (signal 56). At time "c," the gate of transistor $S_5$ is pulled high again (signal 54), turning off $S_5$ and stopping the charging of capacitor $C_{boot}$. At time "d," the voltage at $V_{phase}$ rises again from 0 V to Vin (signal 52). $V_{boot}$ (signal 56) rises from just below $V_{driver}$ to just below $(V_{driver}+V_{in})$. $V_{boot}$ does not rise by an amount equal to $V_{in}$ due to charge lost from $V_{boot}$ to power the gate driver $X_1$. Consequently, when the cycle repeats at time "a" again, $V_{boot}$ ends up lower than $V_{driver}$.

There are many advantages of the solution provided by the present invention, where the charge of capacitor $C_{boot}$ is either restored by switch $S_5$ alone or by $S_5$ and $S_4$ in parallel. First, excellent semiconductor area efficiency for a given voltage drop is achieved. The present invention allows lower supply voltages to be used than in the prior art. External high side FETs driven by the circuit (not shown, at $V_{out}$) are driven harder, resulting in a more efficient switch mode power converter. The voltage at $V_{boot}$ can be charged to a voltage very close to $V_{driver}$ in accordance with the present invention. This is desired because FETs $MN_1$ and $MN_2$ are typically of similar types, requiring similar gate drives to turn on. If $V_{boot}$ is charged to the same voltage as $V_{driver}$, both $MN_1$ and $MN_2$ will see identical amounts of gate drive when turned on. Furthermore, fewer external components are required than when using the external diode $D_1$ of the prior art. Using a transistor $S_5$ in place of diode $D_1$ as in the second embodiment is possible to implement with or without a charge pump.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. The charge pump circuit of the present invention may be utilized with a power converter in a wide variety of applications, such as digital signal processors, microprocessors, mixed signal analog circuits, telecommunications applications, mobile devices and systems, laptops and personal computers, and any lower power electrical application, in general.

What is claimed is:

1. A circuit, comprising:
    a switch mode power converter adapted to receive an input voltage and a driver voltage being greater than said input voltage, said converter adapted to generate an output voltage, said power converter including a boot capacitor; and
    a means for restoring the charge to said boot capacitor to a voltage substantially equal to said driver voltage, said means being internal to said circuit, said restoring means comprising a first transistor coupled between said driver voltage and a first end of said boot capacitor, where said boot capacitor is restored by said first transistor to a voltage equal to said driver voltage less a voltage drop across said first transistor, said first transistor comprises a PMOS transistor, said first transistor voltage drop being less than 300 mV.

2. The circuit of claim 1 wherein said PMOS transistor has a voltage drop of 100 mV, wherein said driver voltage is approximately 5 volts, and said boot capacitor is adapted to be restored to a boot voltage of approximately 4.9 volts.

3. The circuit of claim 1 wherein said power converter comprises:
   a first driver coupled to said first end of said boot capacitor;
   a first switch driven by said first driver and coupled to said input voltage;
   a second driver powered by said driver voltage; and
   a third switch driven by said second driver and coupled to a second switch at a second end of said boot capacitor.

4. A circuit comprising:
   a buck converter comprising a power converter coupled to a boot capacitor, the power converter adapted to receive an input voltage and a driver voltage being greater than said input voltage, said converter adapted to generate an output voltage;
   a means for restoring the charge to said boot capacitor to a voltage substantially equal to said driver voltage, said means being internal to said circuit, said restoring means comprising a first transistor coupled between said driver voltage and a first end of said boot capacitor, where said boot capacitor is restored by said first transistor to a voltage equal to said driver voltage less a voltage drop across said first transistor; and
   a charge pump circuit providing said driver voltage, said charge pump circuit coupled to said buck converter and having a plurality of switches, said restoring means comprising a first transistor coupled between said driver voltage and a first end of said boot capacitor.

5. The circuit of claim 4 wherein said first transistor is adapted to recharge said boot capacitor to a voltage of +/−200 mV said driver voltage.

6. The circuit of claim 4 wherein said boot capacitor is adapted to be rechargeable to a boot voltage exactly equal to said driver voltage.

7. The circuit of claim 4 wherein said buck converter further comprises:
   a first driver powered by the voltage of said boot capacitor;
   a second transistor driven by said first driver and coupled to the input voltage;
   a second driver powered by said driver voltage; and
   a third transistor driven by said second driver and coupled to said second transistor and a second end of said boot capacitor.

8. The circuit of claim 7 wherein said charge pump circuit comprises:
   a pump capacitor coupled at a first end to said first transistor at a first node;
   a first switch coupled between said first node and said driver voltage;
   a second switch coupled between said first node and said input voltage;
   a third switch coupled between said input voltage and a second end of said pump capacitor; and
   a fourth switch coupled between said second end of said pump capacitor and a ground terminal.

9. The circuit of claim 8 wherein said first switch and said third switch of said charge pump circuit are closed when said second transistor is off and said third transistor of said buck converter is on.

10. The circuit of claim 9 wherein said first transistor and said first switch are adapted to charge said boot capacitor in parallel, wherein said voltage of said boot capacitor is rechargeable to a voltage equal to said driver voltage less the voltage across said first transistor plus the voltage across said first switch.

11. A switch mode power converter circuit adapted to receive an input voltage and generate an output voltage, said circuit comprising:
   a charge pump circuit providing a driver voltage greater than said input voltage, said charge pump circuit including at least a first switch and a first transistor; and
   a buck converter having a boot capacitor coupled to said first transistor and selectively to said first switch of said charge pump circuit, wherein said first switch and said first transistor are adapted to recharge said boot capacitor in parallel to a voltage substantially equal to said driver voltage, wherein said boot voltage is equal to said driver voltage less the voltage across said first transistor plus the voltage across said first switch.

12. The circuit of claim 11 wherein said first switch and said first transistor are adapted to recharge said boot capacitor in parallel to a voltage exactly equal to said driver voltage.

13. The circuit of claim 11 wherein said boot voltage equals said driver voltage +/−200 mV.

14. A method of restoring a charge to a boot capacitor of a switch mode power converter circuit, said converter adapted to receive an input voltage and generate a driver voltage being greater than said input voltage, said method comprising the steps of:
   restoring said charge to said boot capacitor, said restored charge of said boot capacitor being substantially equal to said driver voltage, said restoring means being internal to said circuit, wherein said step of restoring comprises using a synchronous rectifier to restore said charge to said boot capacitor, said synchronous rectifier being internal to said circuit and being coupled between said driver voltage and a first end of said boot capacitor, wherein said boot capacitor is rechargeable to a voltage equal to said driver voltage less the voltage drop across said synchronous rectifier.

15. The method of claim 14, wherein said step of restoring further comprises the step of:
   providing a charge pump circuit having a first switch selectively coupled to said first end of said boot capacitor, wherein said step of restoring further comprises using said first switch to restore said charge to said boot capacitor, and wherein current flows through said synchronous rectifier and said first switch in parallel during said restoring step.

16. The method of claim 15 wherein said step of restoring comprises restoring said charge of said boot capacitor to a voltage equal to said driver voltage less the voltage drop across said synchronous rectifier plus the voltage drop across said first switch.

17. The method of claim 16 wherein said step of restoring comprises restoring said charge of said boot capacitor to a voltage equal to said driver voltage +/−200 mV.

18. The method of claim 16 wherein said step of restoring comprises restoring said charge of said boot capacitor to a voltage exactly equal to said driver voltage.

* * * * *